United States Patent [19]
Jordhamo et al.

[11] Patent Number: 5,454,506
[45] Date of Patent: Oct. 3, 1995

[54] STRUCTURE AND PROCESS FOR ELECTRO/MECHANICAL JOINT FORMATION

[75] Inventors: George M. Jordhamo, Wappingers Falls; Louis H. Wirtz, Calverton, both of N.Y.

[73] Assignee: International Business Machines Corporation, Armonk, N.Y.

[21] Appl. No.: 204,117

[22] Filed: Mar. 1, 1994

[51] Int. Cl.⁶ ............................. B23K 20/10; H01R 4/02
[52] U.S. Cl. ..................... 228/110.1; 174/84 R; 228/175
[58] Field of Search .................... 228/135, 136, 228/110.1, 175; 29/866; 174/84 R

[56]   References Cited

U.S. PATENT DOCUMENTS

| | | | |
|---|---|---|---|
| 3,468,731 | 9/1969 | Obeda | 156/73.1 |
| 3,728,183 | 4/1973 | Wasco et al. | 156/73.1 |
| 3,781,596 | 12/1973 | Galli et al. | 228/180.22 |
| 4,546,409 | 10/1985 | Yoshino et al. | 228/110.1 |
| 4,589,584 | 5/1986 | Christiansen et al. | 228/111.5 |
| 4,648,179 | 3/1987 | Bhattacharyya | 29/832 |
| 5,031,308 | 7/1991 | Yamashita et al. | 29/830 |
| 5,303,862 | 4/1994 | Bross et al. | 228/175 |
| 5,326,412 | 7/1994 | Schreiber et al. | 29/849 |

*Primary Examiner*—Kenneth J. Ramsey
*Attorney, Agent, or Firm*—Lawrence D. Cutter

[57]   ABSTRACT

A bonding method joins together a plurality of conductively coated polymers in a single operation. The method employs heat generation via a high energy source, whose output is focused by an energy director which causes fusing of the polymer surfaces along with fusing of the metal surfaces at their respective interfaces to form a robust electrical and mechanical bond.

11 Claims, 3 Drawing Sheets

STRUCTURE AND PROCESS FOR ELECTRO/MECHANICAL JOINT FORMATION

BACKGROUND OF THE INVENTION

The present invention pertains to methods and means for simultaneously joining together electrical and other components through the application of directed energy, such as ultrasonic energy. More particularly, the present invention is directed to electro/mechanical joint formation by the application of directed energy, typically ultrasonic energy, in order to simultaneously bond together polymer substrates and metal circuit patterns which are present as conductive coatings on separate substrates.

Ultrasonic bonding methods are used to permanently bond two or more parts made of a polymer material, particularly when or where it is undesirable to use adhesives. The use of adhesives can adversely effect the strength of the mechanical joint in instances where the joint is exposed to certain chemicals, solvents, pressures and temperatures. In addition, ultrasonic bonding requires little or no surface preparation, is very fast, can be readily automated, and no fixture or cure time is required for the parts after the process is complete.

Ultrasonic bonding of metals is also known. Permanent bonding obviates the need for mechanical fasteners such as screws, bolts or rivets as well as eliminating the need for other bonding methods such as brazing or soldering. Ultrasonic bonding of metals generally creates an improved electrical joint in that the interface between the two mating parts is essentially eliminated.

In certain applications, it is necessary or desired to provide a joint with both mechanically robust and electrically conductive characteristics. It would be desirable to take advantage of the unique features that ultrasonic bonding can provide, however, to date, it is not known how to achieve this on a conductively coated plastic part. Each bonding operation can be done separately, as described above; however, simultaneous bonding is difficult. One of the reasons for this is that for polymer to polymer ultrasonic bonding, the ultrasonic energy is applied to each part so that the movement of one part relative to the other is a direct impact motion (hammer type movement). However, with metal to metal ultrasonic bonding, the movement of one part relative to the other is sheer (one part sliding against the other). Accordingly, the desired direction of motion for bonding polymers and metals is different and seemingly incompatible.

Bonding of conductively coated polymer surfaces together is useful in many applications among which are, to name bit a few: (1) the sealing of housings for the control of electromagnetic interference (EMI); (2) the protection of electronic packages from electrostatic discharge (ESD) events; and (3) the affixation of surface mount components to thermoplastic circuit cards.

OTHER PATENTS DISCUSSING ULTRASONIC BONDING METHODS

U.S. Pat. No. 4,546,409 appears to teach that ultrasonic energy can be applied in order to create a metal to metal bond between a multitude of surfaces. However, the method discussed in this patent is specific to semiconductor devices.

Likewise, the teachings of U.S. Pat. No. 3,468,731 appear to disclose only the ultrasonic bonding of polymers to polymers exclusively. There are apparently no discussions of bonding metal surfaces or conductively coated polymer surfaces.

U.S. Pat. No. 4,589,584 seems to apply to ultrasonic bonding of a filled polymer to another filled polymer with simultaneous bonding of an unfilled polymer to another unfilled polymer. An electrical connection is achieved by using a conductive filler in the filled polymer. An example of this is the use of silver particles in a thermoplastic matrix. A number of other disclosed fillers which can be used includes glass, mica and minerals. However these fillers would not provide distinct electrical connections and would in fact destroy the desired insulative properties of polymeric substrates or circuit boards.

OBJECTS OF THE INVENTION

Accordingly, it is an object of the present invention to provide a method for bonding a plurality of conductively coated polymer substrates to each other in a single operation by applying directed energy to the objects to be bonded.

Another object of the present invention is to achieve a structurally strong mechanical bond and a low resistance electrical connection by selecting proper joint geometry, metallurgical structure and metal location. Various joint configurations are shown including butt joints, tongue and groove joint, and step joints among others, depending upon the mechanical and electrical characteristics required of the bond.

A further object of the present invention is to provide a non-chemical, non-solvent reaction or cure of an interposer adhesive disposed between a component and substrate, while simultaneously forming an electrical connection for certain circuit devices including, but not limited to, surface mount technology devices.

Yet another object of the present invention is to provide a structure that does not require special bonding methods and is readily adaptable to conventional bonding equipment like that utilized in ultrasonic bonding.

SUMMARY OF THE INVENTION

This invention relates to a method for joining at least two conductively coated polymer substrates, especially where the conductive coating has been selectively patterned. A conductive layer is present on those substrate regions where an electrical bond is to be formed. The conductive coating is absent from those areas where a mechanical bond is to be formed. The substrates are then placed in a configuration where the locations at which a mechanical bond is to be formed are in contact and in which the locations where an electrical bond is to be formed are also in contact. The directed energy is then applied to the substrates so as to simultaneously fuse together the conductive coatings and the polymer substrates respectively.

Once the energy source is applied to the surfaces to be bonded, the metal to metal and polymer to polymer joints are created in the same operation. The parts to be joined are provided with a special geometry, which insures that energy transfer occurs in a favorable direction to simultaneously assure end-to-end contact of polymeric materials and side-by-side contact of metal portions.

GLOSSARY OF TERMS

As used herein and in the appended claims, the following terminology is used:

A polymer is any non electrically conductive material used in two or more surfaces to be joined which will melt and fuse together; nonconductive material includes but is not limited to plastics, polymers, and thermoplastics.

"Bonding" refers to any method for joining a plurality of surfaces including, but not limited to, use of a directional high energy source. A joint is any permanent junction of a plurality of surfaces.

"Conductive coating" refers to any conductive material suitable for use as a coating on polymeric materials. "Metallized" refers to having a surface permanently covered with an electrically conductive material. "Metal" refers to any electrically conductive material suitable for use as a coating on other materials.

A mechanical bond is a joint which responds to tensile and sheer forces so as to assure the structural integrity of the device; and an electrical bond provides a low resistance electrical path.

"Flash" refers to the extrusion of molten polymer over the metal portions which generally adversely affects electrical conductivity. Directed energy is any high energy source, including but not limited to, ultrasonic energy.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

A DETAILED DESCRIPTION OF THE INVENTION

Figure 1:
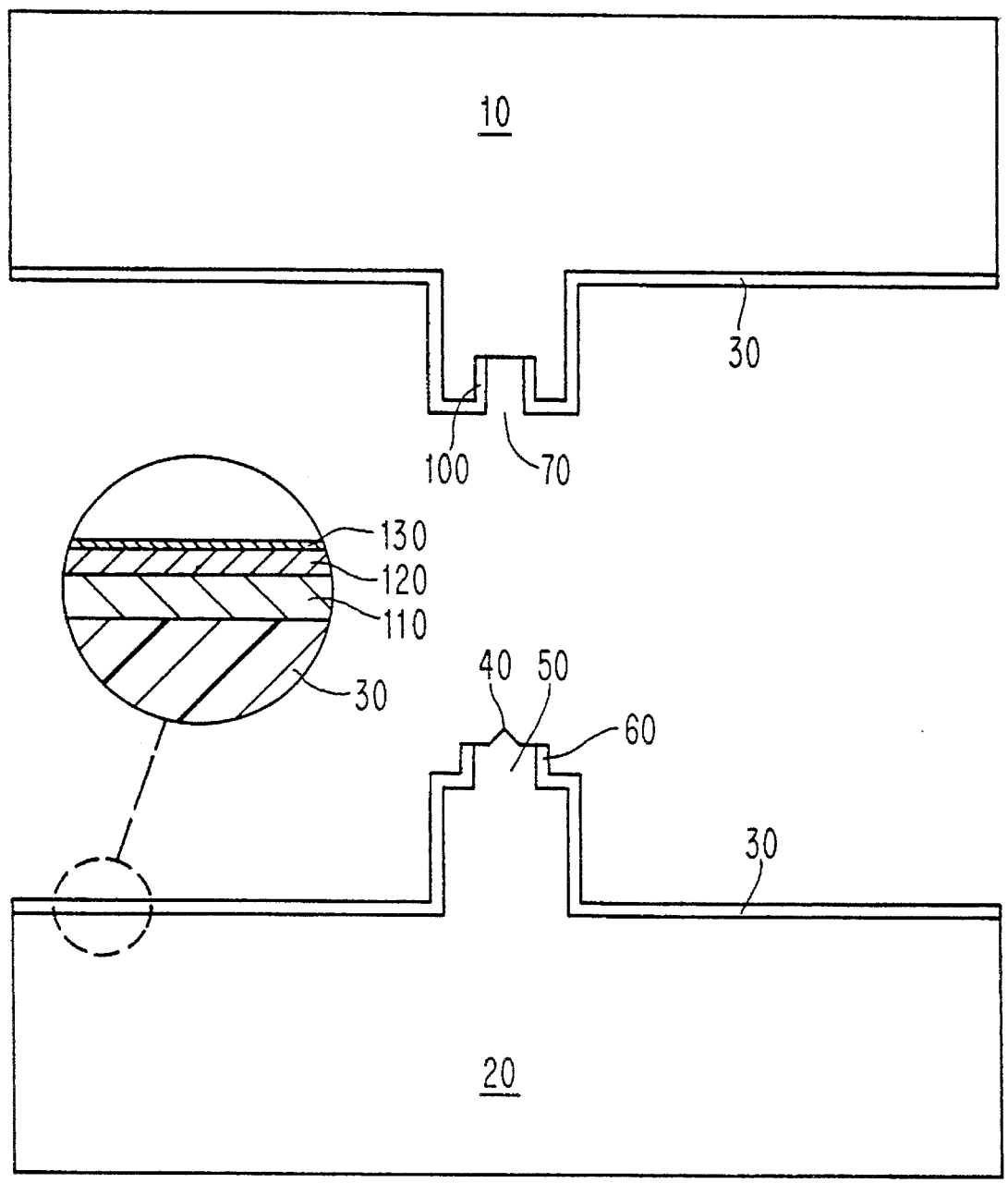
FIG. 1 is a side view illustrating the plating geometry for a tongue and groove joint design in accordance with the present invention.

According to the principles of this invention, FIG. 1 is an illustration of a plating geometry employing a tongue-in-groove joint design. To obtain an electro-mechanical joint, first a conductive coating is applied to selected areas where an electrical bond is to be formed. Metal coating is not applied to areas where a mechanical bond is to be formed. The presence of the metal coating in some areas and its absence in other areas allow a polymer to polymer bond to be achieved while at the same time forming the metal to metal bond. Clearly, the method is also applicable to parts in which appropriate metal patterns have already been disposed. Metal coating can be easily removed from any area through selective etching, mechanical abrasion or other methods.

The method of joint configuration of FIG. 1 illustrates two mating portions 10 and 20 to be joined. Each mating portion includes conductively coating 30. Tongue feature 50 includes energy director 40 which is not coated with metal, or from which the metal has been removed prior to bonding. Metal 60 is however left on side walls of tongue 50. Mating part 10 of portion 20 possesses groove structure 70. Groove 70 is dimensioned to accept tongue 50. Groove 70 is not coated with conductive material in the area at the base of the groove, or metal is removed from this area prior to bonding. Metal 100 is left on the side walls of groove 70.

The metallurgical structure in a preferred embodiment comprises a number of conductive layers deposited on a polymer substrate. The metallurgical structure preferably comprises layers of electroless/electroplated copper 110, electroplated nickel 120, and electroplated gold 130 respectively. The thicknesses of the copper, nickel, and gold coatings are approximately 1000 microinches, 85 microinches and 30 microinches, respectively.

Figure 2:
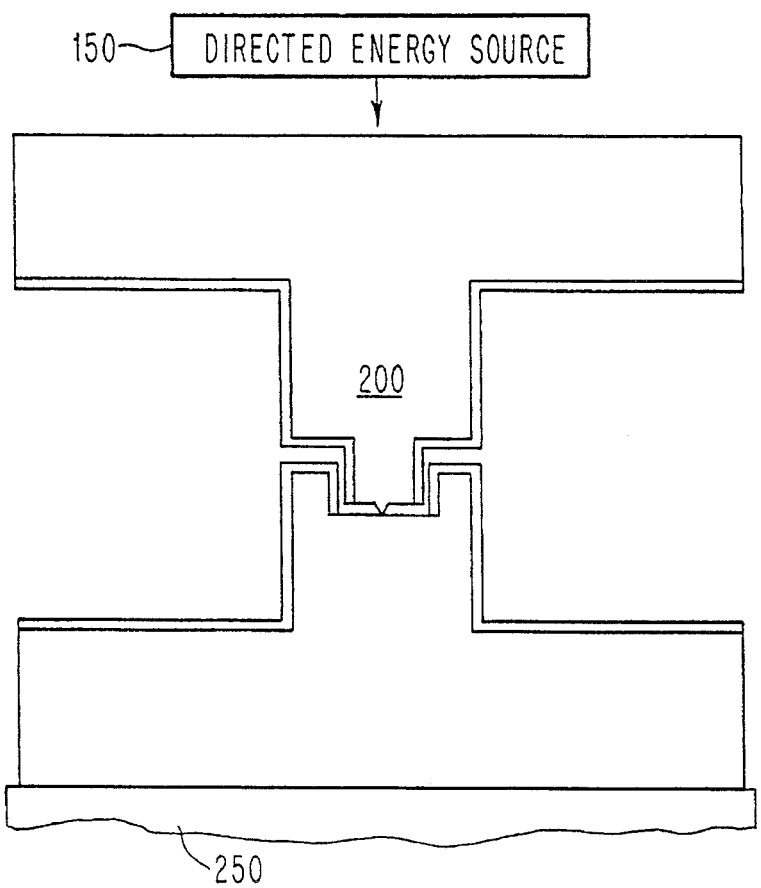
FIG. 2 is a side view similar to FIG. 1 but more particularly showing the application of a directed energy source to two mating surfaces as the two surfaces are brought together.

To achieve a robust electro-mechanical joint, the two mating halves, as shown in FIG. 2 are loaded into a jig or a fixture 250 and ultrasonically bonded using standard ultrasonic bonding methods.

Figure 3:
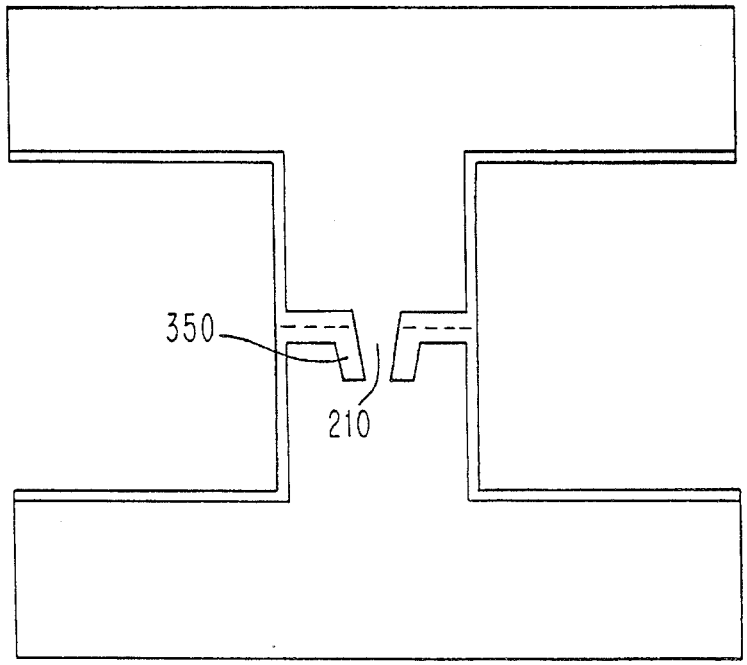
FIG. 3 is a side view similar to FIG. 2, except that it illustrates the resultant geometry after the two mating metal and polymer surfaces are fused together to form a single, unitary structure.

FIGS. 2 and 3 is a further illustration of the application of an ultrasonic energy source 150 to two portions 200 and 300 to be joined and the resultant geometry in a tongue-in-groove joint configuration, respectively. FIG. 3 in particular illustrates the general shape of the completed polymeric bond 210 and the completed metal bond 350. The clamping pressure, bonding time, and energy delivered are all variables which can be changed in dependence on the desired characteristics of the bond. In one embodiment the ultrasonic energy used ranged between 40 and 300 Ws (Watt-seconds), the clamping pressure ranged between 10 and 30 psi and energy pulse was applied for a time ranging between 0.1 and 0.5 seconds.

The joint configuration described above is utilized in a number of different applications in which two or more parts are to be joined to form a mechanically robust structure and at the same time to achieve a low resistance electrical connection between conductive patterns on the mating portions. Some applications include, but are not limited to housings (connectors, sub-assemblies), thermoplastic printed circuit boards (both two and three dimensional), and the attachment of devices to printed circuit boards and other substrates.

Figure 4:
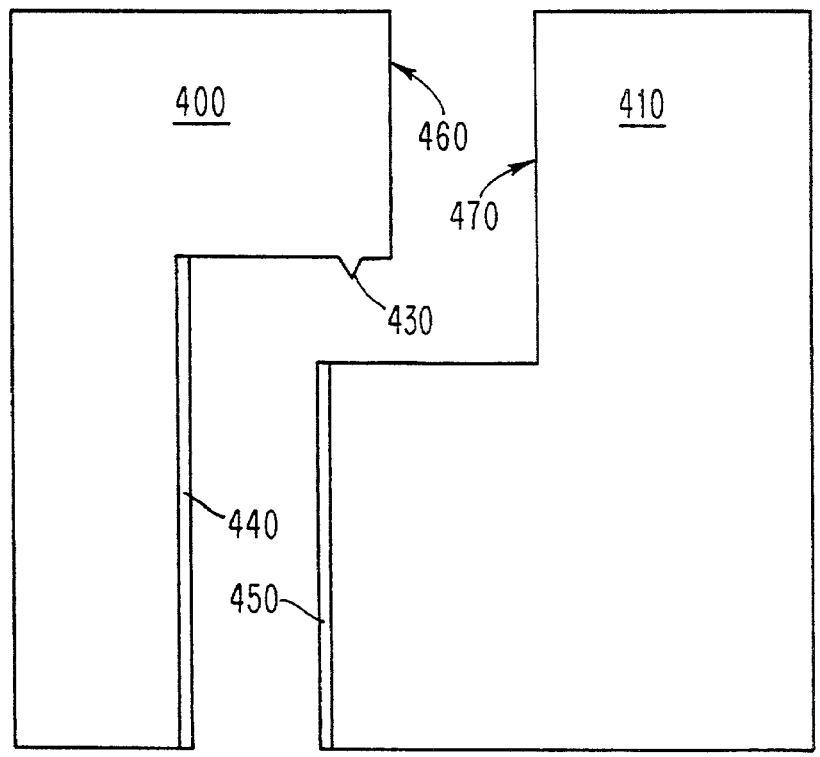
FIG. 4 is a side view similar to FIG. 1 but more particularly illustrating a different embodiment with a step joint geometry, in further accordance with the present invention.

In addition, although a tongue-in-groove joint configuration is described above, other configurations can be used. FIG. 4 shows another geometry that can be utilized. FIG. 4 illustrates the two mating portions 400 and 410 to be joined. Each mating portion 400 and 410 includes conductively coated regions 440 and 450, respectively. One mating portion 400 includes energy director 430 which is not coated with metal (or from which the metal has been removed prior to bonding). To prevent flashing, the geometry is designed so that when mating halves 440 and 450 are joined, the two sides 460 and 470 of each mating portion 400 and 410 are not joined and a space or gap remains between the two sides 460 and 470.

Figure 5:
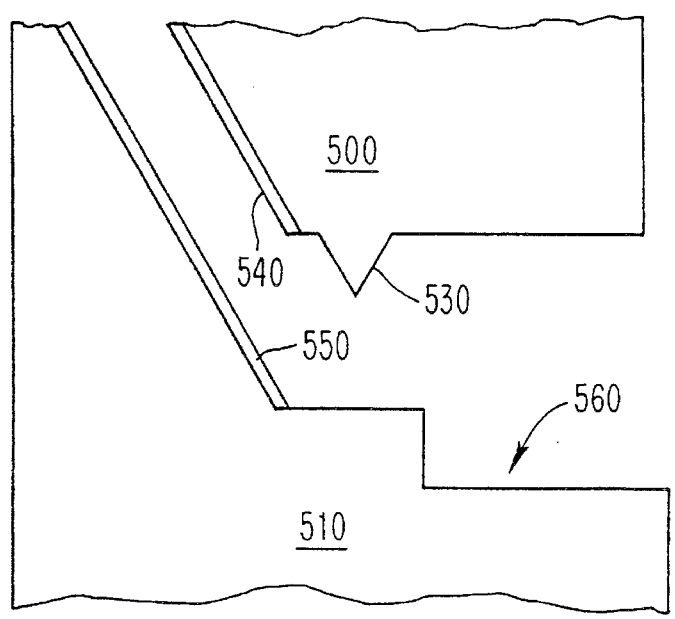
FIG. 5 is a side view similar to FIG. 1, illustrating an alternate geometry.

Similarly, FIG. 5 shows yet another possible joint design. FIG. 5 also illustrates two mating portions 500 and 510 to be joined with one mating portion including energy director 530 which is not coated with metal (or from which the metal has been removed prior to bonding). Conductive material 540 and 550 is present on mating portions 500 and 510 respectively. One side of one of the mating portions (here 510) possesses a set-back 560 from its top surface to reduce or eliminate the flashing problem.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for joining substrates, said method comprising the steps of:

applying a conductive layer on each one of said substrates at a first location where an electrical bond is to be formed and providing a second location, on each one of said substrates, which is free of conductive material where a mechanical bond is to be formed;

placing said substrates in a non-overlapping configuration wherein said second locations, where a mechanical bond is to be formed, are in end-to-end contact and in which said second locations, where an electrical bond is to be formed, are in side-by-side contact; and applying directed energy to said substrates so as to fuse said conductive layers and said polymer substrates.

2. The method of claim 1, wherein said conductive layer is applied on each one of said substrates; and said conductive layer is then removed from said second locations where a mechanical bond is to be formed.

3. The method of claim 1, wherein the directed energy is ultrasonic.

4. The method of claim 1, in which the substrates to be joined further comprise a butt joint configuration.

5. The method of claim 1, in which the surfaces to be joined further include a step joint configuration with tapered ends and a pocket to prevent molten polymeric substrate material from flashing to substrate surfaces.

6. The method of claim 1, in which the surfaces to be joined further include a butt joint configuration with tapered ends and a pocket to prevent molten polymer from flashing to substrate surfaces.

7. The method of claim 1, in which the conductive layer comprises a metal suitable for diffusion bonding.

8. The method of claim 1, in which said conductive layer includes layers of nickel, copper and gold.

9. The joined substrates made in accordance with claim 1.

10. A combination of non-overlapping polymeric substrates each having a conductive layer thereon wherein said polymeric substrates have been fused together at the edges thereof in end to end configuration and in which said conductive layers thereon have also been fused together at the edges thereof in side by side configuration.

11. A method for joining at least two conductively coated polymer substrates, said method comprising the steps of:

placing said substrates in a non-overlapping configuration in which locations where a polymeric bond is to be formed are placed in end-to-end contact and locations where an electrical bond is to be formed are placed in side-to-side contact; and applying directed energy to said substrates so as to fuse said conductive coatings and said polymer substrates.

* * * * *

UNITED STATES PATENT AND TRADEMARK OFFICE
CERTIFICATE OF CORRECTION

PATENT NO. : 5,454,506
DATED : Oct. 3, 1995
INVENTOR(S) : George M. Jordhamo; Louis H. Wirtz It is certified that error appears in the above-indentified patent and that said Letters Patent is hereby corrected as shown below:

Col. 5, line 21        Delete "second" and substitute therefor --first--.

Signed and Sealed this

Twenty-first Day of May, 1996

Attest:

BRUCE LEHMAN

Attesting Officer        Commissioner of Patents and Trademarks